United States Patent [19]

Chang

[11] Patent Number: 4,665,508

[45] Date of Patent: May 12, 1987

[54] GALLIUM ARSENIDE MESFET MEMORY

[75] Inventor: Christopher T. Chang, Dallas, Tex.

[73] Assignee: Texas Instruments Incorporated, Dallas, Tex.

[21] Appl. No.: 738,201

[22] Filed: May 23, 1985

[51] Int. Cl.[4] .................................................. G11C 7/02

[52] U.S. Cl. .................................... 365/208; 365/154; 365/190

[58] Field of Search ............... 365/205, 207, 208, 190, 365/154, 202

[56] References Cited

U.S. PATENT DOCUMENTS 4,568,957 2/1986 Zuleeg et al. ......................... 357/22

4,586,166 4/1986 Shah .................................... 365/154

*Primary Examiner*—Joseph A. Popek

*Attorney, Agent, or Firm*—Carlton H. Hoel; Leo N. Heiting; Melvin Sharp

[57] ABSTRACT

The disclosure relates to the chip organization and circuit arrangement of a gallium arsenide MESFET memory for high speed, low power and radiation hard application. The memory is organized into several columns, each column having several memory cells and a sense amplifier. The write and read/sense data buses are placed at the input and output of the sense amplifier to provide better impedance matching to the write and read/sense circuits. The memory circuit as well as the output circuit utilize a combination of d-mode and e-mode gallium arsenide transistors in judicious arrangement to obtain low power requirements and reduced chip size relative to prior art gallium arsenide systems providing the same function and having the same general read access time.

12 Claims, 6 Drawing Figures

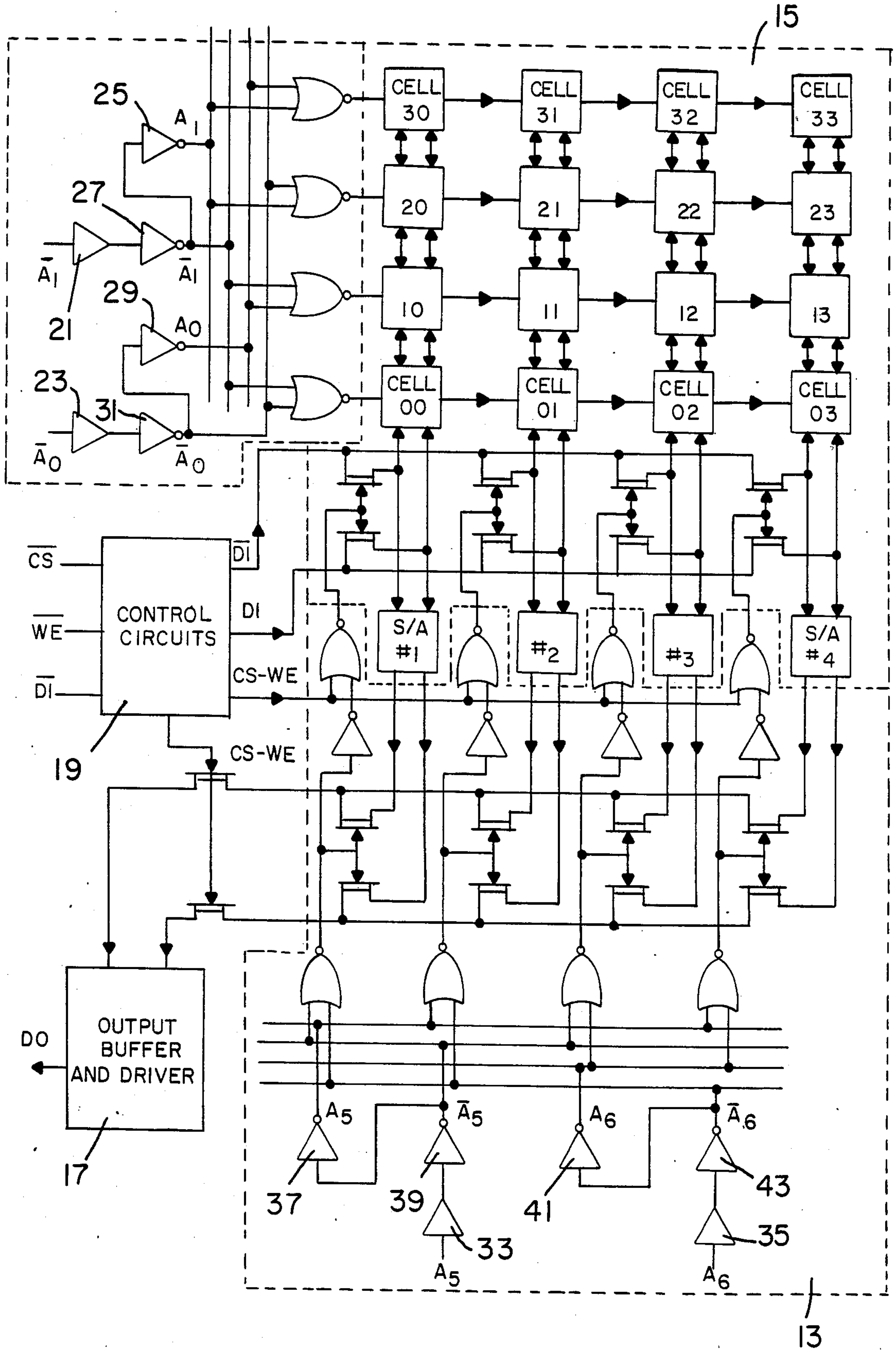
F I G. 2

GALLIUM ARSENIDE MESFET MEMORY

BACKGROUND OF THE INVENTION

1. Field of the Invention

This invention relates to a gallium arsenide MESFET memory and, more specifically, to a gallium arsenide MESFET memory which utilizes enhancement mode (e-mode) transistors in the memory cells and depletion mode (d-mode) transistors in the driver circuits.

2. Brief Description of the Prior Art

Prior art gallium arsenide memory circuits, such as, for example, one reported in Paper No. 4 of the Gallium Arsenide IC Symposium of 1981, used a quasi-normally-off gallium arsenide FET where the threshold voltage, $V_t$, for the switching FETs is chosen to be approximately zero. By using appropriate biasing schemes, such circuits using what is termed low pinch-off FET logic were operated with wider threshold variations (i.e., $V_t$ approximately $\pm 0.15$ volts for $V_t$ approximately zero volts) with a corresponding increase in circuit power dissipation. In another prior art publication entitled Gallium Arsenide Memory Technology Development Technical Report, by W. V. McLevige, et al., AFWAL-TR-81-1290, Mar. 19, 1982, all switching functions were designed with small e-mode MESFETs. While the e-mode memory cells have performed well, the limited current carrying capacity of the e-mode MESFET tends to require large e-mode MESFETs in the peripheral driving circuits (i.e., with large device width). This large device width can result in a decrease in circuit speed as well as an increase in circuit power dissipation. The desire in the art is to provide a gallium arsenide memory wherein power dissipation is minimized and wherein the chip area occupied by the components is also minimized.

SUMMARY OF THE INVENTION

In accordance with the present invention, the above noted result is achieved and there is provided a mixture of enhancement mode and depletion mode FETs in the peripheral circuits. This has resulted in a substantial reduction of the device size from that of the all enhancement switching FET design and, at the same time, provided the same driving current. The depletion mode FETs operate at higher speed than do enhancement mode FETs and provide more current for driving. On the other hand, enhancement mode transistors are used for memory and require less power than do depletion mode FETs thereby providing a saving in energy utilization. In addition, the higher current provided by the depletion mode drivers provides an increase in speed of operation of the enhancement mode memory cells.

The memory circuits in accordance with the present invention are a part of a gallium arsenide static RAM which includes address and control circuits for addressing and controlling the memory array, a memory array, control circuits for controlling the memory array and the output circuit and the output circuit itself. The memory array is composed of n columns having m cells in each column. The preferred embodiment herein discloses four columns with four cells in each column. Each column includes a sense amplifier to perform the read operation for its respective column, other peripheral circuitries for determining whether a read function or a write function to be performed is included. Each memory cell includes a pair of depletion mode transistors which are driven by the row address line. Each memory cell consists of two inverters for storing binary information and two depletion-mode FETs for accessing. The inverters are formed from an enhancement mode FET switch and a depletion mode load device. The two inverters are cross-coupled (i.e., the drain of the switching FET of one inverter is connected to the gate of the switching FET of the other inverter and vice versa) to form a bistable device (i.e., flip flop) and are connected between $V_{DD}$ and ground. The gates of the pass FETs are driven by an address line (wordline). A high voltage applied to the word line connects the output nodes (i.e., the load and switching FET junctions) to the bit lines. This memory cell arrangement is of standard type except for the use of the depletion mode transistors for the driving function and the enhancement mode transistors for the memory function. As stated above, this combination of elements provides for a substantial decrease in chip size for the same memory capacity as well as a substantial decrease in operating current requirement.

BRIEF DESCRIPTION OF THE DRAWINGS

FIG. 2 is a block diagram of the chip organization of a fully decoded gallium arsenide static RAM in accordance with the present invention;

DESCRIPTION OF THE PREFERRED EMBODIMENT

Figure 1:
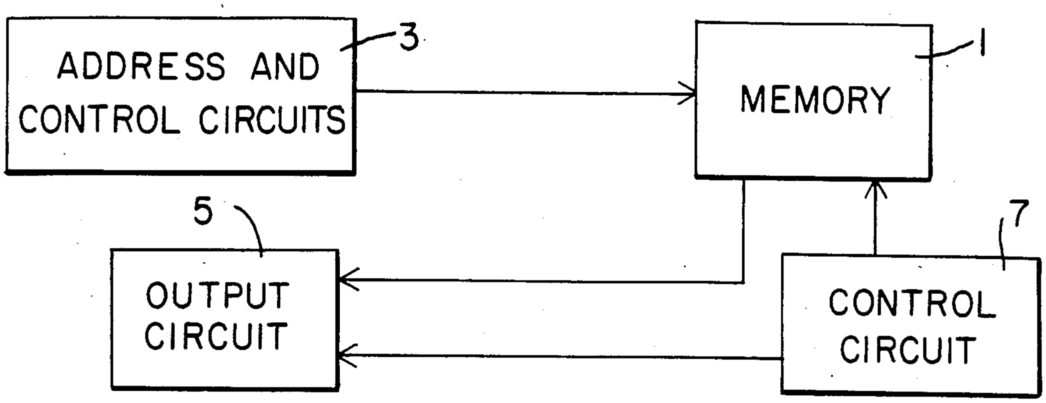
FIG. 1 is a block diagram of a gallium arsenide static RAM in accordance with the present invention.

Referring now to FIG. 1, there is shown block diagram of the components of a typical static RAM. The circuit includes the memory array 1 which is addressed and under control of address and contrl circuits 3. The circuit also includes an output circuit 5 and a control circuit 7 which controls both the memory and the output circuit.

Figure 3:
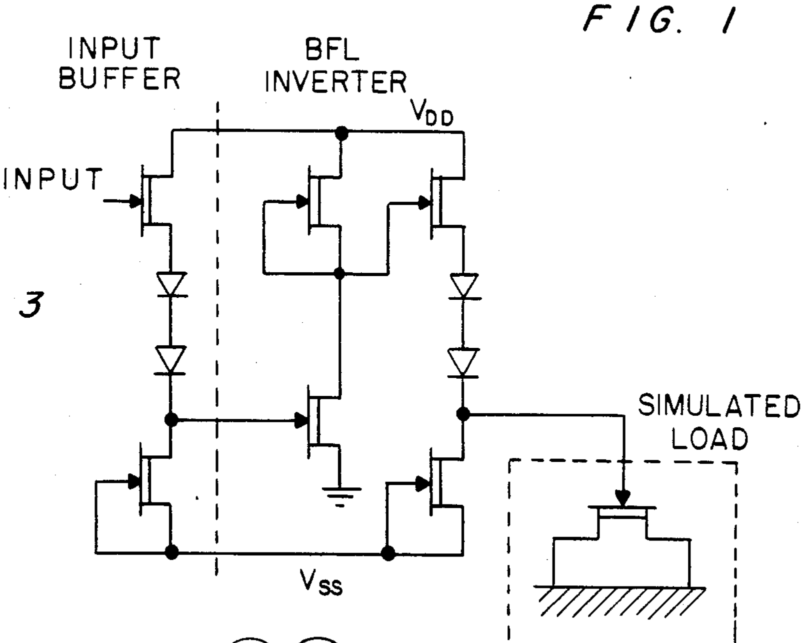
FIG. 3 is a circuit diagram of the input buffer and the BFL inverter in accordance with the present invention.

Referring now to FIG. 2, there is shown a block diagram of the chip organization of a fully decoded gallium arsenide static RAM. The block diagram of FIG. 2 includes memory address and control circuits which are shown in dotted lines at 11 and 13 and which are shown in greater detail in FIG. 6. The memory cells with sensing amplifiers shown in the dotted lines as 15 are shown in greater detail in FIG. 4. The output buffer and driver circuit 17 of FIG. 2 is shown in greater detail in FIG. 5 and the input buffer and BFL inverter portion of the address and control circuits 11 of FIG. 2 and FIG. 6 are shown in greater detail in FIG. 3.

The control circuits 19 of FIG. 2 receive the inputs $\overline{CS}$ (chip select), $\overline{WE}$ (write enable) and $\overline{DI}$ (data input) and provide the outputs $\overline{DI}$, DI and $\overline{CS.WE}$ and CS.WE in standard manner which requires no further explanation except for the fact that these signals will actually be present. The circuitry described herein is generaly known in the prior art except for the specific circuit arrangement of the memory cells and the output circuit.

Referring again to FIG. 2, a specific memory cell is selected by providing a binary signal on the inputs $A_0$ and $A_1$ as well as on the inputs $A_5$ and $A_6$. The $A_0$ and $A_1$ signals will provide one of four row selections whereas the $A_5$ and $A_6$ signals will provide one of four column selections, thereby providing a unique one out of 16 selection of one of the cells of the memory. In addition, in the event there are plural memory chips in a more complex circuit, the $\overline{CS}$ input to the control circuits 19 will be properly energized to determine whether this particular chip has been selected and it will be assumed herein that the chip has been selected. The $\overline{WE}$ input to the control circuits is energized when the write function is to be enabled. When the $\overline{WE}$ line is not energized, it is assumed by the circuit that a read function is to be performed and the circuit operates accordingly. The $\overline{DI}$ input provides the input data when writing.

Figure 6:
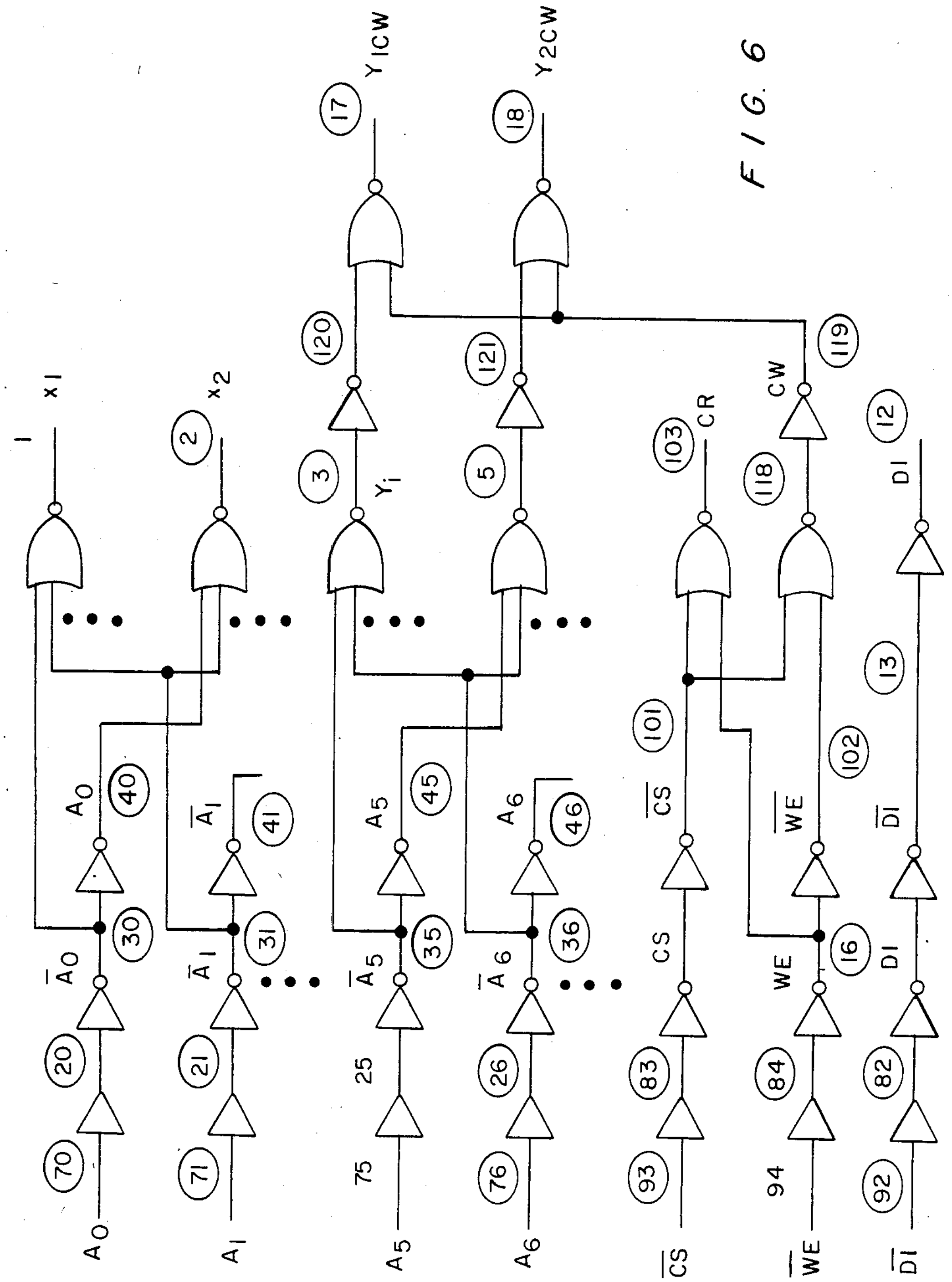
FIG. 6 is a schematic diagram of the memory address and control circuits in accordance with the present invention.

The construction of the control circuits 19 is shown in the bottom portion of FIG. 6. The circuitry for the buffers 21 and 23 of FIG. 2 is shown in greater detail in FIG. 3 as are the inverters 25, 27, 29 and 31 of FIG. 2.

Figure 4:
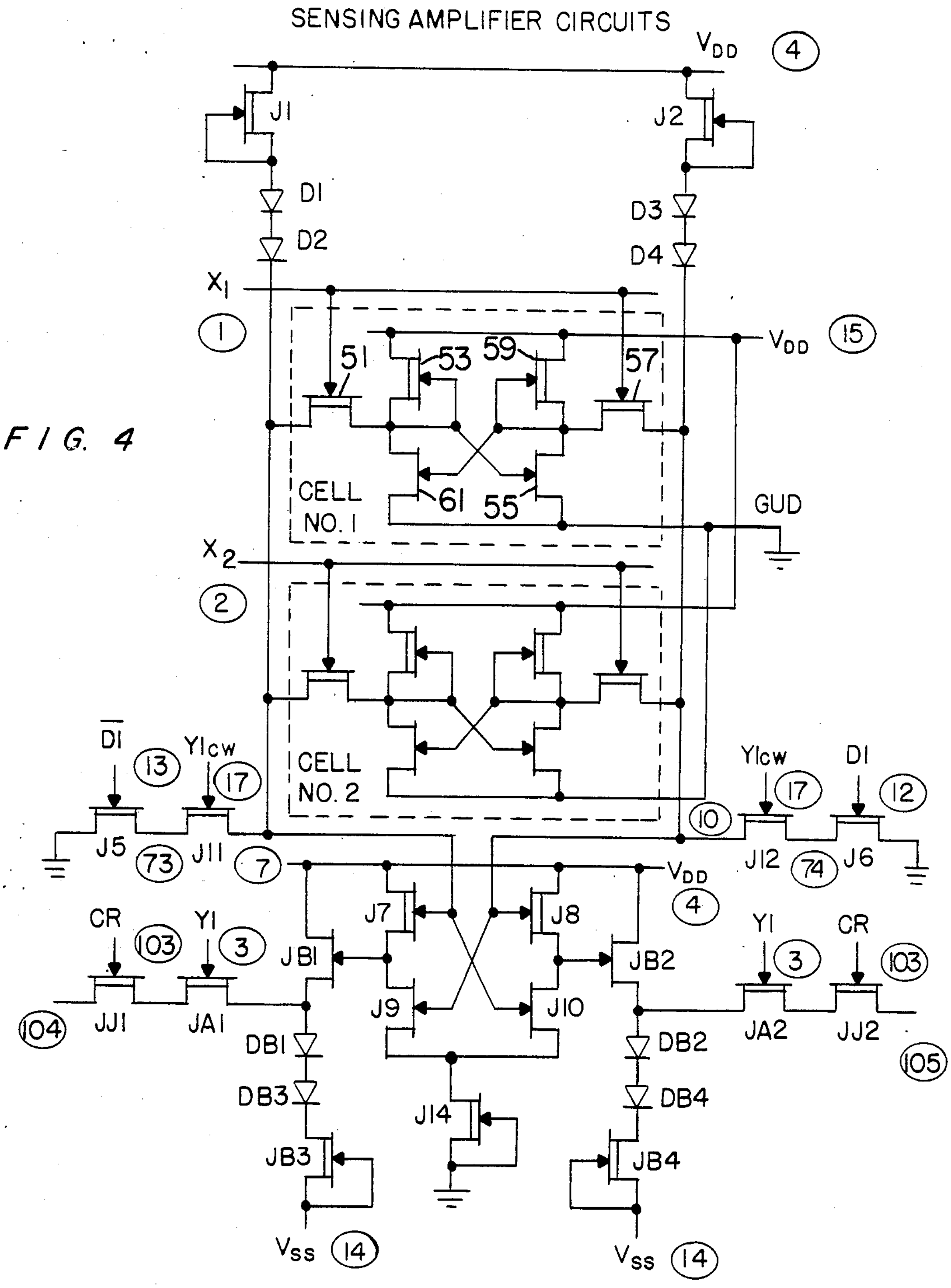
FIG. 4 is a circuit diagram of the memory cells and sensing amplifier circuits in accordance with the present invention.

Referring now to FIG. 4, a write operation will be described. A write signal $\overline{DI}$ is supplied at the gate of transistor J5 and and the inverse DI is supplied at the gate of transistor J6, these signals coming from control circuit 19 in FIG. 2. This signal is also shown as a DI output at node 12 and a $\overline{DI}$ output at node 12 and a DI output at node 13 in FIG. 6. These nodes 12 and 13 are also shown in FIG. 4. The signal $y_{1cw}$, which is the y decoding signal, is provided at terminal 17 in FIG. 6 and is a result of the output signals provided in FIG. 6 from the input signals to the control circuits 19 shown in FIG. 2. The signal $y_{1cw}$ is applied to the transistor switches J11 and J12 in FIG. 4. The fact that operation is taking place in the write mode causes the $y_{1cw}$ to turn on the transistor switches J11 and J12. With switches J11 and J12 turned on, the nodes 7 and 10, as shown in FIG. 4, are connected to nodes 73 and 74 respectively. If $\overline{DI}$ on transistor J5 is low, then DI on transistor J6 is high and vice versa. Therefore assuming that $\overline{DI}$ is high, node 7 will be at ground and node 10 will be at high voltage since transistor J6 is off.

If an address signal is provided on line $x_1$ of FIG. 4 from the line $x_1$ of FIG. 6, then the transistors 51 and 57 in cell No. 1 having their gates connected thereto are turned on. This causes a selection of cell number 1 and will pull node 7 down and in turn pull node 10 up, providing a toggle action. In this manner, the appropriate signal is stored in cell 1. It can be seen that cell 1 has been chosen due to the selection of the $X_1$ signal and the $y_{1cw}$ signal at output 17 in FIG. 6 which is specifically associated with address signals $A_5$ and $A_6$.

For the read operation, the $y_{1cw}$ signal on transistors J11 and J12 is such as to turn off these transistors, thereby cutting out the possibility of a write operation. Therefore node 7 and node 10 are connected to the sense amplifier composed of transistors J7, J8, J9, J10 and J14. This sense amplifier corresponds to the sense amplifier S/A No. 1 of FIG. 2. The application of an address signal to line 1 turns on the transistors 57 and 51 of cell No. 1 as in the write operation. Since the transistors J11 and J12 are off due to the signal $y_{1cw}$ on the gates thereof, and assuming that the node 7 is high and the node 10 is low, the high signal on node 7 is applied to the gates of d-mode transistor J7 and e-mode transistor J10, making the transistor J7 less conducting and transistor J10 more conducting. Also, the low signal on node 10 makes the d-mode transistor J8 more conducting and the e-mode transistor J9 less conducting. This provides a positive differential signal between nodes 15 and 16. Alternatively, with a low signal on node 7 and a high signal on node 10 there is provided a negative differential signal between nodes 15 and 26.

The transistors JA1 and JA2 are controlled by the $y_i$ signal which is taken from node 3 as shown in FIG. 6 and is essentially a column address signal. When the proper column address signal and other signals have been provided to provide the $y_i$ signal, the transistors JA1 and JA2 will conduct and apply the signals applied thereto to the succeeding d-mode transistors JJ1 and JJ2. These transistors JJ1 and JJ2 are controlled by the CR signal on node 103 as shown in FIG. 6 which is a composite signal derived from the $\overline{CS}$ and WE signals as shown in FIG. 6. Since the chip containing cell No. 1 has been selected ($\overline{CS}$) and the write enable ($\overline{WE}$) is off, the CR signal is provided and the output from cell No. 1 is applied at the output terminals 104 and 105 as shown in FIG. 4.

Figure 5:
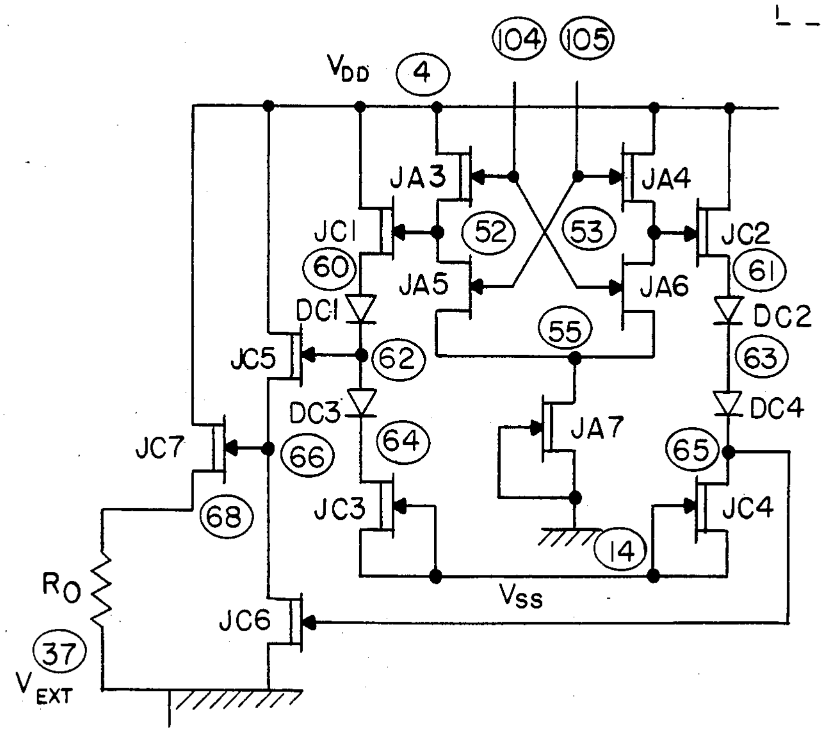
FIG. 5 is a circuit diagram of the output circuit in accordance with the present invention.

Referring now to FIG. 5, there is shown in detail the output circuit which is shown in FIG. 2 as output buffer and driver 17. It can be seen in FIG. 5 that the outputs 104 and 105 from FIG. 4 are applied as inputs 104 and 105 to the output circuit. In FIG. 5, the combination of d-mode transistors JA3 and JA4, e-mode transistors JA5 and JA6 and d-mode transistor JA7 are similar in operation to the sense amplifier of FIG. 4 as previously described. However, there is only one sense amplifier in the output circuit of FIG. 5 that oprates for the entire memory which, in the preferred embodiment herein, contains 16 cells. It can be seen in the case of the output circuit that signals to transistors JC1 and JC2 are applied to depletion mode transistors whereas enhancement mode transistors JB1 and JB2 were used in conjunction with the sense amplifiers of FIG. 4. This arrangement is utilized to provide greater power since the power is important rather than the voltage signal. Accordingly, a driver which is small in size but produces more current is provided. It is desired to pull d-mode transistor JC5 up and to pull d-mode transistor JC6 down. It can therefore be seen that transistor JC6 is connected at its gate to node 65 whereas transistor JC5 is connected at its gate to node 62. It can also be seen that the voltage drop to node 62 will be less than the voltage drop to node 65 since node 62 is at the junction of diodes DC1 and DC3, whereas node 65 is at the gate-cathode junction of the second diode of the diode pair DC2, DC4. Therefore the gate of transistor JC5 is at a voltage which is equal to the voltage drop across diode DC3 higher than the voltage at the gate of transistor JC3.

It can be seen that if the output terminal at node 68 is to be high, it is necessary that d-mode transistor JC7 be turned on and that if the terminal 68 is to be low, then transistor JC7 should be turned off. This is accomplished by the voltage at node 66 which is the voltage on the gate of transistor JC7. Accordingly, since, in the example being provided, terminal 104 is high and terminal 105 is low, node 53 will be at a lower voltage and node 52 will be at a higher voltage. Therefore, transistor JC2 will have a high voltage applied to the gate thereof and transistor JC1 will have a low voltage applied to the gate thereof, thereby making transistor JC1 conduct more, transistor JC2 conduct less. This will cause the voltage on node 62 to be at a higher voltage state and the voltage on node 65 to be at a lower voltage state, thereby causing transistor JC5 to turn on and transistor JC6 to turn off, causing high voltage to be placed at terminal 66 and causing transistor JC7 to conduct to thereby apply a high voltage to the output terminal 68. It is readily apparent that for reversed voltages at terminals 104 and 105, the opposite signal will be applied at output terminal 68. $R_O$, as shown, represents the output load.

It can be seen that there has been provided a gallium arsenide static RAM which can be made substantially smaller in size relative to prior art gallium arsenide static RAMs having the same storage capacity and which operates with reduced energy dissipation relative to similar prior art devices.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A sense amplifier which comprises, in combination:

(a) a source of power and a reference voltage source, (b) a first pair of depletion mode transistors, each having source and drain electrodes and a control electrode, said source electrode of each transistor of said first pair being coupled to said source of power, (c) a second pair of enhancement mode transistors, each having source and drain electrodes and a control electrode, said drain electrodes of each transistor of said second pair being coupled to said source of reference voltage, the drain of one of said first pair of transistors being coupled to the source of one of said second pair of transistors and the drain of the other of said first pair of transistors being coupled to the source of the other of said second pair of transistors, (d) first signal supply means coupled to the gate of said one of said first pair and the gate of the other of said second pair, and (e) second signal supply means coupled to the gate of said other of said first pair and gate of the one of second pair.

2. A sense amplifier as set forth in claim 1 wherein said transistors are formed of gallium arsenide.

3. A sense amplifier as set forth in claim 1 wherein said transistors are MESFETS.

4. A sense amplifier as set forth in claim 2 wherein said transistors are MESFETs.

5. A sense amplifier as set forth in claim 1 wherein said first and second signal supply means comprise d-mode transistors.

6. A sense amplifier as set forth in claim 2 wherein said first and second signal supply means comprise d-mode transistors.

7. A sense amplifier as set forth in claim 3 wherein said first and second signal supply means comprise d-mode transistors.

8. A sense amplifier as set forth in claim 4 wherein said first and second signal supply means comprise d-mode transistors.

9. A sense amplifier as set forth in claim 5 wherein said first and second signal supply means comprise gallium arsenide MESFET transistors.

10. A sense amplifier as set forth in claim 6 wherein said first and second signal supply means comprise gallium arsenide MESFET transistors.

11. A sense amplifier as set forth in claim 7 wherein said first and second signal supply mans comprise gallium arsenide MESFET transistors.

12. A sense amplifier as set forth in claim 8 wherein said first and second signal supply means comprise gallium arsenide MESFET transistors.

* * * * *